United States Patent
Berens et al.

(10) Patent No.: US 7,362,190 B2
(45) Date of Patent: Apr. 22, 2008

(54) OSCILLATOR CIRCUIT WITH HIGH PASS FILTER AND LOW PASS FILTER IN OUTPUT STAGE

(75) Inventors: Michael T. Berens, Austin, TX (US); James R. Feddeler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 87 days.

(21) Appl. No.: 11/297,884

(22) Filed: Dec. 9, 2005

(65) Prior Publication Data
US 2007/0132519 A1 Jun. 14, 2007

(51) Int. Cl.
*H03B 5/36* (2006.01)

(52) U.S. Cl. ................ 331/74; 331/77; 331/158
(58) Field of Classification Search ........... 331/74, 331/77, 158
See application file for complete search history.

(56) References Cited

U.S. PATENT DOCUMENTS

| | | | | |
|---|---|---|---|---|
| 5,355,099 A | * | 10/1994 | Murooka | 331/158 |
| 5,455,542 A | * | 10/1995 | Spence et al. | 331/158 |
| 6,278,338 B1 | * | 8/2001 | Jansson | 331/116 FE |
| 6,696,898 B1 | | 2/2004 | Ward et al. | |
| 6,774,735 B2 | | 8/2004 | Senthilkumar et al. | |

OTHER PUBLICATIONS

Eric A. Vittoz, et al.—High-Performance Crystal Oscillator circuits: Theory and Application; IEEE Journal Of Solid-State Circuits, vol. 23, No. 3, Jun. 1988.

* cited by examiner

*Primary Examiner*—Robert Pascal
*Assistant Examiner*—James Goodley
(74) *Attorney, Agent, or Firm*—James L. Clingan, Jr.; Daniel D. Hill

(57) ABSTRACT

An integrated circuit has an internal oscillator circuit for being connected to an external frequency source such as a crystal or a ceramic resonator. The internal oscillator circuit has an inverting amplifier across the frequency source terminals to establish an oscillation there. One terminal of the frequency source is coupled to one input of the comparator and to a second input of the comparator through a low pass filter. Coupling the output of the low pass filter to the second input of the comparator is for preventing a DC offset from developing between the two inputs of the comparator. The other terminal of the frequency source is coupled to the second input of the comparator through a high pass filter. The high pass filter provides the comparator with a larger voltage differential to increase noise margin. Noise margin is further improved by allowing an increase in hysteresis in the comparator.

20 Claims, 1 Drawing Sheet

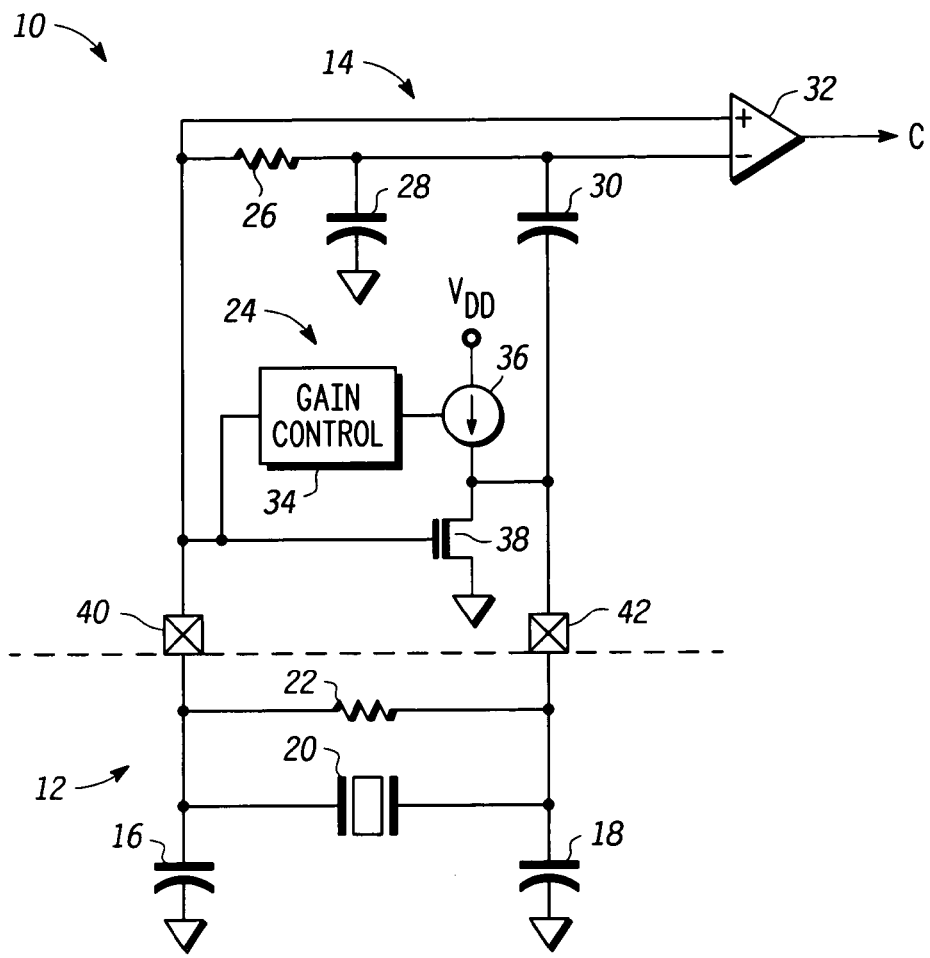
FIGURE

OSCILLATOR CIRCUIT WITH HIGH PASS FILTER AND LOW PASS FILTER IN OUTPUT STAGE

FIELD OF THE INVENTION

This invention relates generally to circuits useful in integrated circuits, and more particularly to oscillators.

RELATED ART

Oscillators are generally used for generating the clocks that control the timing of the operation of an integrated circuit. As with any aspect of an integrated circuit, it is desirable for it to be low cost while maintaining the desired functionality at the desired speed. Frequency sources such as crystals and ceramic resonators have been found to be effective components in establishing reliable clocks. The external nature of these frequency sources can lead to problems caused by leakage currents. As oscillator designs trend towards lower power consumption, oscillator signal amplitudes also become lower. This has made the shift in voltage due to leakage more significant with respect to the oscillator signal, reducing signal to noise ratio and noise margin.

Accordingly, there is a need for an oscillator that overcomes or reduces the impact of the adverse effects of leakage and/or other external factors on the lower amplitude signals generated by oscillators.

BRIEF DESCRIPTION OF THE DRAWINGS

The present invention is illustrated by way of example, and not by way of limitation, in the FIGURE of the accompanying drawing and in which like reference numerals refer to like elements and in which:

The sole FIGURE is a circuit diagram of an oscillator according to an embodiment of the invention.

DESCRIPTION OF A PREFERRED EMBODIMENT

In one aspect, an integrated circuit has an internal oscillator circuit for being connected to an external frequency source such as a crystal or a ceramic resonator. The internal oscillator circuit has an inverting amplifier across the frequency source terminals to establish an oscillation across the two terminals of the frequency source. One terminal of the frequency source is coupled to one input of the comparator and to a second input of the comparator through a low pass filter. Coupling the output of the low pass filter to the second input of the comparator prevents a DC offset from developing between the two inputs of the comparator. The other terminal of the frequency source is coupled to the second input of the comparator through a high pass filter. The high pass filter provides the comparator with a larger voltage differential to increase noise margin. It also allows for more hysteresis in the comparator. This is better understood with reference to the FIGURE and the following description.

Shown in the sole FIGURE is an oscillator 10 comprising a passive oscillator network 12, an oscillator circuit 14, pad 40, and pad 42. In this example, passive oscillator network 12 is outside of an integrated circuit while oscillator circuit 14 is part of an integrated circuit and directly connected to pads 40 and 42, which also would be part of the same integrated circuit. Pads 40 and 42 are any part of an integrated circuit or integrated circuit package to which an external circuit is to be connected. Passive oscillator network 12 comprises a capacitor 16, a capacitor 18, a frequency source 20, and a resistor 22. Examples of frequency source 20 are crystals and ceramic resonators. Capacitor 16 has a first terminal connected to ground and a second terminal for being connected to pad 40. Frequency source 20 has a first terminal connected to the second terminal of capacitor 16 and a second terminal for being connected to pad 42. Capacitor 18 has a first terminal connected to ground and a second terminal connected to the second terminal of frequency source 20. Resistor 22 has a first terminal connected to the first terminal of the frequency source and a second terminal connected to the second terminal of the frequency source. The first and second terminals of frequency source 20 can be viewed as first and second terminals of passive oscillator network 12. The first and second terminals of passive oscillator network 12 are for being connected to pads 40 and 42, respectively. This configuration of passive oscillator network 12 is common for being external to an integrated circuit for use in setting the frequency of operation. Thus, capacitor 16, capacitor 18, frequency source 20, and resistor 22 are chosen by a user for this purpose.

Oscillator circuit 14 comprises an inverting amplifier 24, a resistor 26, a capacitor 28, a capacitor 30, a comparator 32, pad 40, and pad 42. Inverting amplifier 24 comprises a gain control circuit 34, a current source 36, and an N channel transistor 38. Comparator 32 has a positive input connected to pad 40, an output for providing a clock signal C, and a negative input. Resistor 26 has a first terminal connected to pad 40 and a second terminal connected to the negative input of comparator 32. Capacitor 28 has a first terminal connected to the second terminal of resistor 26 and a second terminal connected to ground. Capacitor 30 has a first terminal connected to pad 42 and a second terminal connected to the negative input of comparator 32. Inverting amplifier 24 has an input connected to pad 40 and an output connected to pad 42. Gain control 34 has an input and an output. Transistor 38 has a gate connected to the input of gain control 34 and together forms the input of inverting amplifier 24. Gain control 24 also has an output. Current source 36 has a current input connected to a positive power supply terminal VDD, a control input connected to the output of gain control 34, and a current output. Transistor 38 has a source connected to ground and a drain connected to the current output of current source 36. The drain of transistor 38 and the current output of current source 36 together form the output of inverting amplifier 24. The combination of capacitor 30 and resistor 26 can be viewed as a high pass filter. The combination of resistor 26 and capacitor 28 can be viewed as a low pass filter. Inverting amplifier 24 can be considered a gain stage.

In operation passive oscillator network 12 and oscillator circuit 14 are connected together as shown in the FIGURE to provide an oscillation that is converted to a clock C. At the desired frequency, frequency source 20 and capacitors 16 and 18 provide a 180 degree phase shift. Inverting amplifier 24 also provides a 180 degree phase shift to obtain the desired oscillation. Resistor 22 provides a DC bias to the input of oscillator circuit 14. Gain control 34 detects the oscillation amplitude at the input of oscillator circuit 14 and adjusts the current source 36 to avoid excessive power consumption. The operation of resistor 22, capacitors 16 and 18, frequency source 20, and inverting amplifier 24 are well known in the art for producing an oscillating signal for conversion to a clock signal.

Resistor 26 and capacitor 28, as a low pass filter, are for making the DC bias on both inputs of comparator 32 be equal. If they are not equal, the comparator does not see a symmetrical signal. As the DC bias differential increases, the clock signal C will move further and further away from the desired 50% duty cycle. This may eventually result in some circuits not responding to it. DC bias differential can become sufficiently great that the comparator doesn't change output states at all so clock signal C simply stays in one state resulting in a complete loss of the clocking function. Thus it is essential that some compensation such as this low pass circuit be present if there is a risk of a DC bias differential. In addition to keeping the DC bias the same for both inputs of comparator 32 and thus avoiding a DC bias differential, the low pass filter also prevents the AC signal on the positive input from reaching the negative input. Thus, the AC signal on the positive input is centered around the same DC bias which is on the negative input so that the output, clock signal C, is around the 50% duty cycle that is preferable. Capacitor 30, as a high pass filter, couples the second terminal of frequency source 20 and the output of inverting amplifier 24 to the negative input of comparator 32. This results in the negative input of comparator 32 receiving an AC signal that is 180 degrees out of phase from the signal present on the positive input.

With the inputs of comparator 32 being 180 degrees out of phase, the signal differential is increased which causes the signal to noise ratio to be improved. Increasing the signal differential also allows for increasing the hysteresis in comparator 32, which further increases noise immunity. Thus the low pass filter of resistor 26 and capacitor 28 is for avoiding problems with DC bias offset while the high pass filter of capacitor 30 and resistor 26 provides for increased signal differential and the consequent improvement in noise margin. Capacitors 30 and 28 have a voltage division effect that works to reduce the amplitude of the signal on the negative input of comparator 32. To reduce this adverse effect, capacitor 30 should have a capacitance value greater than that of capacitor 28.

Various changes and modifications to the embodiments herein chosen for purposes of illustration will readily occur to those skilled in the art. For example, a different type of inverting amplifier may be used. To the extent that such modifications and variations do not depart from the spirit of the invention, they are intended to be included within the scope thereof which is assessed only by a fair interpretation of the following claims.

What is claimed is:

1. An oscillator circuit comprising:
   an input terminal for coupling to a frequency source;
   a gain stage having an input coupled to the input terminal, and an output;
   a low pass filter having an input coupled to the input terminal, and an output;
   a comparator having a first input coupled to the input terminal, a second input coupled to the output of the low pass filter, and an output for providing a clock signal; and
   a first capacitor having a first plate electrode coupled to the second input of the comparator, and a second plate electrode coupled to the output of the gain stage.

2. The oscillator circuit of claim 1, wherein the frequency source is based on a ceramic resonator.

3. The oscillator circuit of claim 1, wherein the frequency source is based on a quartz crystal.

4. The oscillator circuit of claim 1, wherein the low pass filter comprises:
   a resistor having a first terminal coupled to the input terminal, and a second terminal coupled to the second input of the comparator; and
   a second capacitor having a first plate electrode coupled to the second terminal of the resistor, and a second plate electrode coupled to a power supply voltage terminal.

5. The oscillator circuit of claim 4, wherein a capacitance value of the first capacitor is greater than a capacitance value of the second capacitor.

6. The oscillator circuit of claim 1, wherein the oscillator circuit is implemented on an integrated circuit.

7. The oscillator circuit of claim 1, wherein the gain stage comprises:
   a gain control circuit having an input coupled to the input terminal, and an output;
   a current source having a first terminal coupled to a first power supply voltage terminal, a second terminal coupled to the second plate electrode of the capacitor, and a control terminal coupled to the output of the gain control circuit; and
   a transistor having a first current electrode coupled to the second terminal of the current source, a control electrode coupled to the input terminal, and a second current electrode coupled to a second power supply voltage terminal.

8. The oscillator circuit of claim 1, wherein the comparator is an operational amplifier with hysteresis.

9. The oscillator circuit of claim 1, further comprising an output terminal coupled to the output of the gain stage and for coupling to the frequency source.

10. The oscillator circuit of claim 1, wherein the low pass filter causes a DC voltage component at the second input of the comparator to track a DC voltage component at the input terminal.

11. An oscillator circuit comprising:
    an input terminal for coupling to an output of the frequency source;
    an inverting amplifier having an input coupled to the input terminal, and an output;
    a resistor having a first terminal coupled to the input terminal, and a second terminal; and
    a first capacitor having a first plate electrode coupled to the second terminal of the resistor, and a second plate electrode coupled to a power supply voltage terminal;
    a comparator having a first input coupled to the input terminal, a second input coupled to the first plate electrode of the first capacitor, and an output for providing a clock signal;
    a second capacitor having a first plate electrode coupled to the second input of the comparator, and a second plate electrode coupled to the output of the inverting amplifier; and
    an output terminal coupled to the output of the inverting amplifier, the output terminal for coupling to an output of the frequency source.

12. The oscillator circuit of claim 11, wherein the frequency source is based on one of either a ceramic resonator or a quartz crystal.

13. The oscillator circuit of claim 11, wherein a capacitance value of the second capacitor is greater than a capacitance value of the first capacitor.

14. The oscillator circuit of claim 11, wherein the oscillator circuit is implemented on an integrated circuit.

15. The oscillator circuit of claim 11, wherein the inverting amplifier comprises:
    a gain control circuit having an input coupled to the input terminal, and an output;

a current source having a first terminal coupled to a first power supply voltage terminal, a second terminal coupled to the second plate electrode of the second capacitor, and a control terminal coupled to the output of the gain control circuit; and a transistor having a first current electrode coupled to the second terminal of the current source, a control electrode coupled to the input terminal, and a second current electrode coupled to a second power supply voltage terminal.

16. The oscillator circuit of claim 11, wherein the comparator is an operational amplifier with hysteresis.

17. The oscillator circuit of claim 11, wherein the inverting amplifier is further characterized as having gain control.

18. The oscillator circuit of claim 11, wherein the resistor and the first capacitor cause a DC voltage component at the second input of the comparator to track a DC voltage component at the input terminal.

19. A method for providing a clock signal comprising:
receiving an oscillating signal;
low pass filtering the oscillating signal using a low pass filter circuit to provide a low pass filtered oscillating signal;
amplifying the oscillating signal using a gain stage to provide an amplified oscillating signal;
high pass filtering the amplified oscillating signal to provide a high pass filtered oscillating signal;
combining the high pass filtered oscillating signal with the low pass filtered oscillating signal to generate a combined oscillating signal; and
comparing the combined oscillating signal to the oscillating signal to generate the clock signal.

20. The method of claim 19 wherein the oscillating signal is based on one of either a ceramic resonator or a quartz crystal.

* * * * *